United States Patent [19]

Ma

[11] Patent Number: 5,156,556
[45] Date of Patent: Oct. 20, 1992

[54] OFFICE AUTOMATION UNIT

[76] Inventor: Hsi K. Ma, Rm. 813, 8Fl., Chia Hsin Building 2, No. 96, Chung Shan N. Rd., Taipei, Taiwan

[21] Appl. No.: 669,099

[22] Filed: Mar. 13, 1991

[51] Int. Cl.$^5$ .............................................. H05K 7/10
[52] U.S. Cl. .................................. 439/357; 220/4.27; 361/393; 439/928
[58] Field of Search ................ 439/69, 76, 74, 928, 439/357; 361/393, 394, 396; 206/501; 220/4.26, 4.27; 211/188, 194, 126, 11; 312/107, 111

[56] References Cited

U.S. PATENT DOCUMENTS

| | | | |
|---|---|---|---|
| 2,998,896 | 9/1961 | Miller | 220/4.26 |
| 3,029,368 | 4/1962 | Wulc | 361/393 |
| 4,226,491 | 10/1980 | Kazama et al. | 439/76 |
| 4,969,830 | 11/1990 | Daly et al. | 439/341 |

Primary Examiner—Neil Abrams
Attorney, Agent, or Firm—Bucknam and Archer

[57] ABSTRACT

An office automation system flexibly set-up by piling up a variety of office automation units which have each a respective functional PC board set in an independent cartridge. The cartridge has a connector socket at the top and a connector plug at the bottom. By connecting the connector plug of one office automation unit to the connector socket of another office automation unit, several office automation units are electrically connected into a desired office automation system.

1 Claim, 1 Drawing Sheet

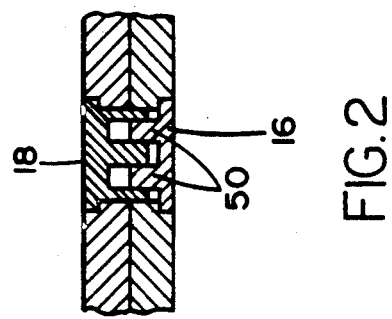
FIG. 2
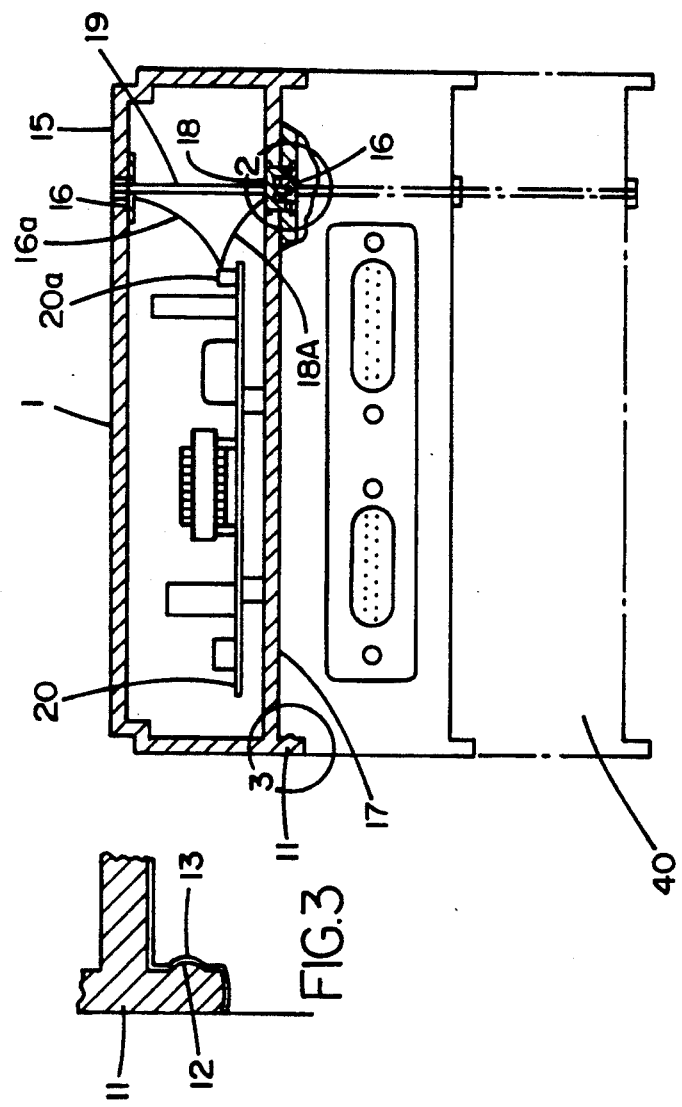
FIG. 1
FIG. 3

OFFICE AUTOMATION UNIT

BACKGROUND OF THE INVENTION

The present invention relates to office automation unit and more particularly to such an office automation unit which is designed for use as a block so that a plurality of office automation units for different functions can be flexibly set up into a desired office automation system.

In recent years, computers and the related periphery equipment have been commonly used in factories, offices as well as at home for handling a variety of jobs. Because of the use of a variety of office machines, much space is required for installation such office machines. However, regular office machines may include some parts which are not requisite to all consumers. Because they are generally packed into a solid unit and not detachable, a consumer shall have to pay more money to buy the entire system. For example, regular personal computer system basically includes mainframe, floppy/hard disc drive, interface slots, monitor, keyboard, I/O devices and etc. Because the related circuits are respectively connected inside the mainframe, the mainframe must be large enough for installation. Further, either part is damaged, the whole personal computer system may become useless.

The present invention has been accomplished with a view to these facts. It is therefore the main object of the present invention to provide such an office automation unit which can be used as a block so that different functional office automation units can be selectively built up into a variety of office automation systems for different purposes.

BRIEF DESCRIPTION OF THE DRAWINGS

FIG. 1 is a sectional view illustrating how a plurality of office automation units are connected together;

FIG. 2 is a schematic drawing illustrating the connection between a connector plug and a connector socket according to the present invention; and FIG. 3 is a schematic drawing illustrating the connection between the raised portion on one office automation unit and the recessed portion on another office automation unit.

DETAILED DESCRIPTION OF THE PREFERRED EMBODIMENT

Turning now to the annexed drawings in greater detail, an office automation unit in accordance with the present invention is generally comprised of an independent cartridge 1 having set therein a circuit board 20 for a specific function. The cartridge 1 has bottom flange 11 at the bottom around the periphery thereof with an elongated, raised portion 12 made thereon in the interior, and a recessed portion at the top around the periphery thereof with an elongated groove 13 made thereon. By engaging the elongated, raised portion 12 of the cartridge 1 of one office automation unit in the elongated groove of the cartridge 1 of another office automation unit, two or more office automation units can be vertically stacked one upon another.

Referring to the drawings again, the cartridge 1 has a connector socket 16 on the top wall 15 thereof which is a known device having openings respectively connected to the circuit board 20 set inside the cartridge, and a connector plug 18 on the bottom wall 17 thereof which protrudes beyond the bottom edge of the cartridge. When two office automation units are piled up, pins 50 of the connector plug 18 of the first office automation unit are communicating with corresponding electrically conducting pins in the connector socket 16 of the second office automation unit forming a closed circuit. Inside the cartridge 1, there are bus lines (which can be each a flat cable or PC board) such as 16A, 18A and 20A respectively connected between the connector plug 18, the connector socket 16 and circuit board 20. For example, a 120-pin type of bus line is connected between the connector plug and the connector socket, wherein pins 1-15 are for a power supply to transmit electric power to all connected office automation units; pins 16-25 are for a first office automation unit to communicate with the mainframe unit; pins 26-35 are for a second office automation unit to communicate with the mainframe unit, and the rest may be inferred by analogy. Signal pins which are not in use in an office automation unit shall not be connected to the circuit board 20 of such unit but directly connected to the connector plug and connector socket of the same unit by flat cable 19. Because each office automation unit can be respectively connected to the mainframe unit 40, the system provides independent function for operation. For example, IO unit can be connected to a printer or other peripheral equipment by external plug (D type connector, as shown in the drawing) when it is connected with power supply unit or mainframe unit. A cover may be provided to cover external plug to keep good sense of beauty.

In the application of the present invention, the mainstream, the hard disc drive, the floppy disc drive, the power supply, the interface, the screen, IO and etc., are respectively made in an independent cartridge forming an independent office automation unit each. For an audio system, it can also be made into a plurality of independent units including CD unit, power supply unit, receiver unit, recorder unit, and etc., for flexible assembly according to one's preference.

Application of the present invention can achieve various advantages as shown hereinafter.

1. No waste parts: Consumer can select those units which are required without paying for what is not to be in use;

2. Easy to built-up: By connecting connector plug with connector socket, selected units can be conveniently set up into operation mode;

3. Expansion possible:

4. Standardized cartridge: Each unit has the same cartridge for easy connection with less space occupation; and 5. Easy to maintain: Any unit can be separately replaced when it fails to work.

The foregoing statement illustrates the preferred embodiment of the present invention. However, it is apparent that various modifications could be made to the present invention without departing from the basic teachings thereof.

What is claimed is:

1. An office automation system comprised of a plurality of office automation units electrically connected together and stacked one upon another, each unit having a circuit board, a main frame connectable to each of said office units, each of said office automation units having a cartridge (1) for holding a respective circuit board (20), said cartridge having a top wall (15) and a bottom wall (17) and a flange (11) at the bottom around the periphery thereof, said flange having an elongated, raised portion (12) formed in the interior thereon, said cartridge having a recessed portion at the top around the periphery thereof with an elongated groove (13) formed thereon, a connector socket (16) on the top wall of said cartridge having contact openings some of which are electrically connected to said circuit board (20), and a connector plug (18) on the bottom wall thereof having contact pins some of which are electrically connected to said circuit board (20) and wherein in operation said elongated, raised portion (12) of the cartridge of one office automation unit is engaged within the elongated groove (13) of the cartridge of another office automation unit and the connector plug of one office automation unit is connected electrically to the connector socket of another office automation unit to form a closed circuit, and two or more office automation units can be vertically stacked one upon another and electrically connected together for on-line operation with the pins of each connector plug (18) being engageable with corresponding openings of the connector socket (16) of an adjoining office unit, when stacked together, a plurality of connecting means (16A, 18A, 20A) operationally connecting said connector socket (16) and said connector plug (18) to said circuit board (20), and cable means (19) directly connecting pins (50) of said connector plug (18) not connected to the circuit board with corresponding openings of said connector socket (16) not connected to the circuit board whereby connection of said cable means to said circuit board (20) is avoided.

* * * * *